United States Patent
Suzuki et al.

(10) Patent No.: US 7,368,011 B2
(45) Date of Patent: May 6, 2008

(54) APPARATUS FOR MANUFACTURING SILICON SINGLE CRYSTAL, METHOD FOR MANUFACTURING SILICON SINGLE CRYSTAL, AND SILICON SINGLE CRYSTAL

(75) Inventors: Youji Suzuki, Yonezawa (JP); Satoshi Sato, Yonezawa (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 231 days.

(21) Appl. No.: 11/192,039

(22) Filed: Jul. 29, 2005

(65) Prior Publication Data

US 2006/0027160 A1  Feb. 9, 2006

(30) Foreign Application Priority Data

Aug. 3, 2004 (JP) ............... 2004-226589

(51) Int. Cl.
*C30B 15/20* (2006.01)
*C30B 35/00* (2006.01)

(52) U.S. Cl. .................. 117/14; 117/15; 117/201; 117/214

(58) Field of Classification Search ............ 117/14, 117/15, 16, 201, 214
See application file for complete search history.

(56) References Cited

U.S. PATENT DOCUMENTS

| 5,846,318 A | * | 12/1998 | Javidi ............... 117/14 |
| 5,961,716 A | * | 10/1999 | White et al. ......... 117/14 |
| 7,172,656 B2 | * | 2/2007 | Takanashi et al. ..... 117/14 |

FOREIGN PATENT DOCUMENTS

| JP | 2000-143388 | 5/2000 |
| JP | 2001-220285 | 8/2001 |

* cited by examiner

*Primary Examiner*—Felisa Hiteshew
(74) *Attorney, Agent, or Firm*—Pillsbury Winthrop Shaw Pittman, LLP

(57) ABSTRACT

The apparatus for manufacturing a silicon single crystal includes: a crucible for storing molten silicon; a pulling-up device for pulling up a silicon single crystal from the molten silicon in the crucible to grow; a detecting device for detecting a position of the crucible in a vertical direction; and a control device for controlling a pulling rate for the silicon single crystal by the pulling-up device, based on the detected position of the crucible.

2 Claims, 4 Drawing Sheets

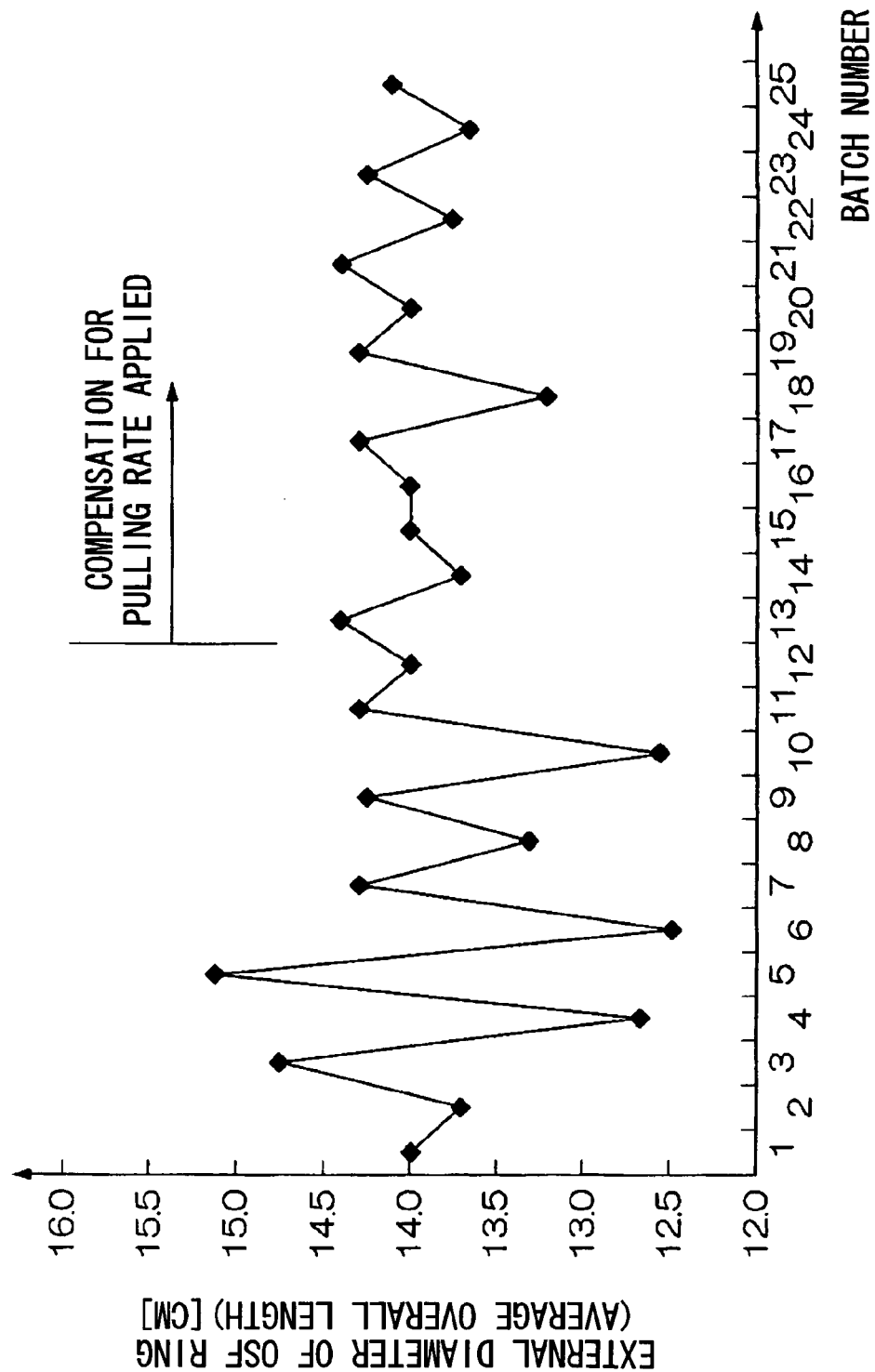

APPARATUS FOR MANUFACTURING SILICON SINGLE CRYSTAL, METHOD FOR MANUFACTURING SILICON SINGLE CRYSTAL, AND SILICON SINGLE CRYSTAL

BACKGROUND OF THE INVENTION

1. Field of the Invention

The present invention relates to an apparatus and a method for manufacturing a silicon single crystal which is manufactured by pulling up a silicon single crystal by the Czochralski method (the CZ method), and to a silicon single crystal which is manufactured by using this apparatus or method.

The present application claims priority on Japanese Patent Application No. 2004-226589, filed on Aug. 3, 2004, the content of which is incorporated herein by reference.

2. Background Art

A silicon single crystal is manufactured by heating up a polycrystalline silicon raw material filled in a crucible using a heater to obtain a molten silicon, and pulling up a silicon single crystal from the molten silicon to grow by the CZ method. A silicon wafer is manufactured by slicing (cutting) the silicon single crystal which is manufactured by the above described method, and integrated circuits is formed on the silicon wafer. Considering a formation of the integrated circuits on the silicon wafer, it is desirable that the silicon wafer has a high quality in which the number of COPs (Crystal Originated Particles) exerting an influence on a gate oxide integrity of the silicon wafer is small. It is well known that COPs occur inside OSF (Oxidation Induced Stacking Fault) rings and dislocation clusters and the like occur when a pulling rate is reduced. Furthermore, it is also known that a distribution of these defects depends on a value (V/G) which is a ratio of the pulling rate V of the silicon single crystal and a temperature gradient G in a vertical direction in a vicinity of a solid-liquid interface of the silicon single crystal. That is to say, it is necessary to keep the value of V/G within a predetermined range in order to manufacture a single crystal in which the number of COPs is low (largely depends on a distribution of defects) with a stabile quality.

However, since the temperature gradient G changes due to various factors in a mass production of the silicon single crystals, in the case in which the silicon single crystal is pulled up at a constant pulling rate V, the value of V/G varies, and as a result, the product quality of the silicon single crystals varies widely. In the following Patent documents 1 and 2, methods for manufacturing silicon single crystals having no defects in which a temperature gradient of the silicon single crystal in a lengthwise direction (a vertical direction) is measured using a non contact temperature sensor, and a pulling rate for the silicon single crystal is controlled based on the measured temperature gradient so as to keep the value of V/G within a predetermined range.

However in the above described prior art, the measurement values measured by the temperature sensor varies greatly, depending on a position of the temperature sensor with respect to the silicon single crystal which is pulled out. Accordingly, it is necessary to adjust the position of the temperature sensor precisely for each production batch, and a lot of work and time are required for arranging and managing the temperature sensor. Here, the production batch means a whole set of processes performed to manufacture one silicon single crystal. Since a large number of apparatuses for manufacturing silicon single crystals are provided in a factory for silicon single crystals, in the case in which temperature sensors are employed for each of them, there is a problem in which a lot of work is required. Also, there is a problem in which a cost of the apparatus for manufacturing the silicon single crystal is increased by the provision of the temperature sensor. Furthermore, there is also a problem that, in the case in which the temperature sensor is provided in the apparatus for manufacturing silicon single crystals, a working efficiency of doing maintenance in an interior of the apparatus (for example, changing carbon members in a furnace and the like) is deteriorated. Due to the above considerations, it would be desirable to keep the value of V/G within the predetermined range by some method other than the method of controlling the pulling rate based on the measurement values measured by the temperature sensor.

Patent document 1 Japanese Unexamined Patent Application, First Publication No. 2000-143388.

Patent document 2 Japanese Unexamined Patent Application, First Publication No. 2001-220285.

SUMMARY OF THE INVENTION

The biggest factors to determine the temperature gradient G when pulling up the silicon single crystal are a structure of a heat insulating material, and a distance (hereinafter referred to as a gap) between a liquid surface of the molten silicon and a lower end of a heat shield member provided over the crucible. Usually, in order to keep this gap constant for eliminating variations in the product quality between each silicon single crystal, the position of the liquid surface of the molten silicon is adjusted. However, the position of the crucible in the vertical direction varies inevitably between production batches in consequence of variations in a thickness of the used crucible (i.e. a quartz crucible), deformation of the crucible occurred when melting the polycrystalline silicon as a raw material, and variations of a shape or individual differences of a graphite susceptor (the carbon crucible) which holds the crucible. Even in the case in which a minute positional deviation of the crucible in the vertical direction is present, a heat conduction of a heat given out from a heating device changes, and as a result, variations in the temperature gradient G are engendered.

Therefore, it is thought that a silicon single crystal can be manufactured with a stable product quality by compensating changes of the temperature gradient G which are generated by changes of the position of the crucible in the vertical direction.

The present invention has been accomplished in the light of the above problems, and one object is to provide an apparatus and a method for manufacturing a silicon single crystal in which the pulling rate is adjusted based on the position of the crucible in the vertical direction. The other object is to provide a silicon single crystal manufactured using the apparatus or the method for manufacturing a silicon single crystal.

In order to solve the above described problems, an apparatus for manufacturing a silicon single crystal of the present invention includes: a crucible for storing molten silicon; a pulling-up device for pulling up a silicon single crystal from the molten silicon in the crucible to grow; a detecting device for detecting a position of the crucible in a vertical direction; and a control device for controlling a pulling rate for the silicon single crystal by the pulling-up device, based on the detected position of the crucible.

In the apparatus for manufacturing a silicon single crystal of the present invention, the control device may calculate an average crucible position by taking an average of positions of the crucible in the vertical direction during manufacturing silicon single crystals over a plurality of times in the past, and the control device may control the pulling rate for the silicon single crystal based on an amount of positional deviation which is a value obtained by subtracting the average crucible position from the detected position of the crucible.

The control device may set the pulling rate for the silicon single crystal to be higher than an initial speed which is set in advance when the amount of positional deviation is positive, and the control device may set the pulling rate for the silicon single crystal to be lower than the initial speed when the amount of positional deviation is negative.

The control device may set the pulling rate for the silicon single crystal higher or lower within a range from 0% to 5% of the initial speed per 1 mm of the amount of positional deviation.

The control device may calculate a standard deviation σ of the positions of the crucible in the vertical direction during manufacturing the silicon single crystals over a plurality of times in the past, and the control device may control the pulling rate for the silicon single crystal as the amount of positional deviation being 3σ when the amount of positional deviation is larger than 3σ.

In order to solve the above described problems, a method for manufacturing a silicon single crystal of the present invention includes: a detecting step of detecting a position in a vertical direction of a crucible when pulling up a silicon single crystal from a molten silicon in the crucible to grow; and a control step of controlling a pulling rate of the silicon single crystal, based on the detected position of the crucible.

In the method for manufacturing a silicon single crystal of the present invention, the control step may further includes: a step of calculating an average crucible position by taking an average of positions of the crucible in the vertical direction during manufacturing silicon single crystals over a plurality of times in the past; and a step of controlling the pulling rate for the silicon single crystal, based on an amount of positional deviation which is a value obtained by subtracting the average crucible position from the detected position of the crucible.

In the control step, the pulling rate for the silicon single crystal may be set to be higher than an initial speed which is set in advance when the amount of positional deviation is positive, and the pulling rate for the silicon single crystal may be set to be lower than the initial speed when the amount of positional deviation is negative.

In the control step, the pulling rate for the silicon single crystal may be set higher or lower within a range from 0% to 5% of the initial speed per 1 mm of the amount of positional deviation.

The control step may further includes: a step of calculating a standard deviation a of the positions of the crucible in the vertical direction during manufacturing the silicon single crystals over a plurality of times in the past, and a step of controlling the pulling rate for the silicon single crystal as the amount of positional deviation being 3σ when the amount of positional deviation is larger than 3σ.

A silicon single crystal of the present invention is manufactured using any one of apparatuses and methods for manufacturing a silicon single crystal described above.

In the apparatus and the method for manufacturing a silicon single crystal silicon single crystal, the pulling rate for the silicon single crystal is controlled based on the detected position of the crucible in the vertical direction. As a result, even in the case in which a heat conduction of a heat given out from a heating device varies depending on the position of the crucible in the vertical direction, the pulling rate for the silicon single crystal is controlled so as to compensate for the variations of the heat conduction. Therefore, it is possible to keep a value (V/G) of a ratio of the pulling rate V of the silicon single crystal and a temperature gradient G in a vertical direction in a vicinity of a solid-liquid interface of the silicon single crystal within a predetermined range, which is extremely important from the point of view of determining defect generation regions such as density and distribution of COPs (defects) and the like. As a result, it is possible to manufacture a silicon single crystal with a stable product quality.

Here, in order to suppress variations of the product quality of the silicon single crystal, it is desirable to adjust the pulling rate minutely based on a feedback of a relative change of the position of the crucible in the vertical direction. In order to do this, an average crucible position may be calculated by taking an average of positions of the crucible in the vertical direction during manufacturing silicon single crystals over a plurality of times in the past, and the pulling rate for the silicon single crystal may be controlled based on an amount of positional deviation which is a value obtained by subtracting the average crucible position from the detected position of the crucible.

In this case, the pulling rate for the silicon single crystal is minutely adjusted based on the relative change of the position of the crucible in the vertical direction, and as a result, it is possible to suppress the variations of the product quality of the silicon single crystal.

In the case in which the amount of positional deviation is positive, the pulling rate for the silicon single crystal may be set to be higher than an initial speed which is set in advance. In the case in which the amount of positional deviation is negative, the pulling rate for the silicon single crystal may be set to be lower than the initial speed.

In the case in which the amount of the positional deviation is positive and thus the position of the crucible in the vertical direction is high, a proportion of the heat conduction from a bottom portion of the crucible is high, and the temperature gradient G becomes large. Considering these, the pulling rate for the silicon single crystal is set to be higher than the initial speed which is set in advance. Conversely, in the case in which the amount of the positional deviation is negative and thus the position of the crucible in the vertical direction is low, the proportion of the heat conduction from a side portion of the crucible is high, and the temperature gradient G becomes small. Considering these, the pulling rate for the silicon single crystal is set to be lower than the initial speed which is set in advance. By doing these, since it is possible to keep the value of V/G within the predetermined range even in the case in which the position of the crucible in the vertical direction varies, it is possible to manufacture a silicon single crystal with a stable product quality.

The pulling rate for the silicon single crystal may be set to be higher or lower within a range from 0% to 5% of the initial speed per 1 mm of the amount of positional deviation. That is, the pulling rate may be controlled to be limited to the above range. Thereby, it is possible to prevent the occurrence of a state in which a compensation amount for the pulling rate for the silicon single crystal becomes too large and the variations in the product quality of the silicon single crystal occur.

Furthermore, a standard deviation σ of the positions of the crucible in the vertical direction during manufacturing the silicon single crystals over a plurality of times in the past may be calculated, and in the case in which the amount of positional deviation is larger than 3σ, the pulling rate for the silicon single crystal may be calculated as the amount of positional deviation being 3σ. Thereby, it is possible to prevent the occurrence of a state in which a compensation amount for the pulling rate for the silicon single crystal becomes too large and the variations in the product quality of the silicon single crystal occur.

According to the present invention, since the pulling rate for the silicon single crystal is controlled based on the detected position of the crucible in the vertical direction, it is possible to manufacture a silicon single crystal with stable product quality.

Under conditions by which OSF regions are formed, in the results obtained using the above described apparatus and the method for manufacturing a silicon single crystal according to the present invention, the variation in the distribution of the OSF diameter is less, as compared with the results without using the apparatus and the method. Accordingly, silicon single crystals can be manufactured of which product quality is stabilized. For example, silicon single crystals can be manufactured of which diameters are 200 mm and external diameters of OSF rings are in a range from 13.2 cm to 14.4 cm. Under conditions by which OSF rings are closed and no dislocation clusters are generated, in the results obtained using the above described apparatus and the method for manufacturing a silicon single crystal according to the present invention, dislocation cluster faults are reduced. Accordingly, silicon single crystals can be manufactured of which product quality is stabilized. For example, silicon single crystals can be manufactured in which dislocation cluster faults are reduced by 5%, as compared with the results without using the apparatus and the method.

BRIEF DESCRIPTION OF THE DRAWINGS

FIG. 4 is a figure showing an example of measurement results for external diameters of OSF rings in silicon wafers manufactured using the apparatus and the method for manufacturing a silicon single crystal of the present invention, and those manufactured without using the same.

DETAILED DESCRIPTION OF THE INVENTION

Figure 1:
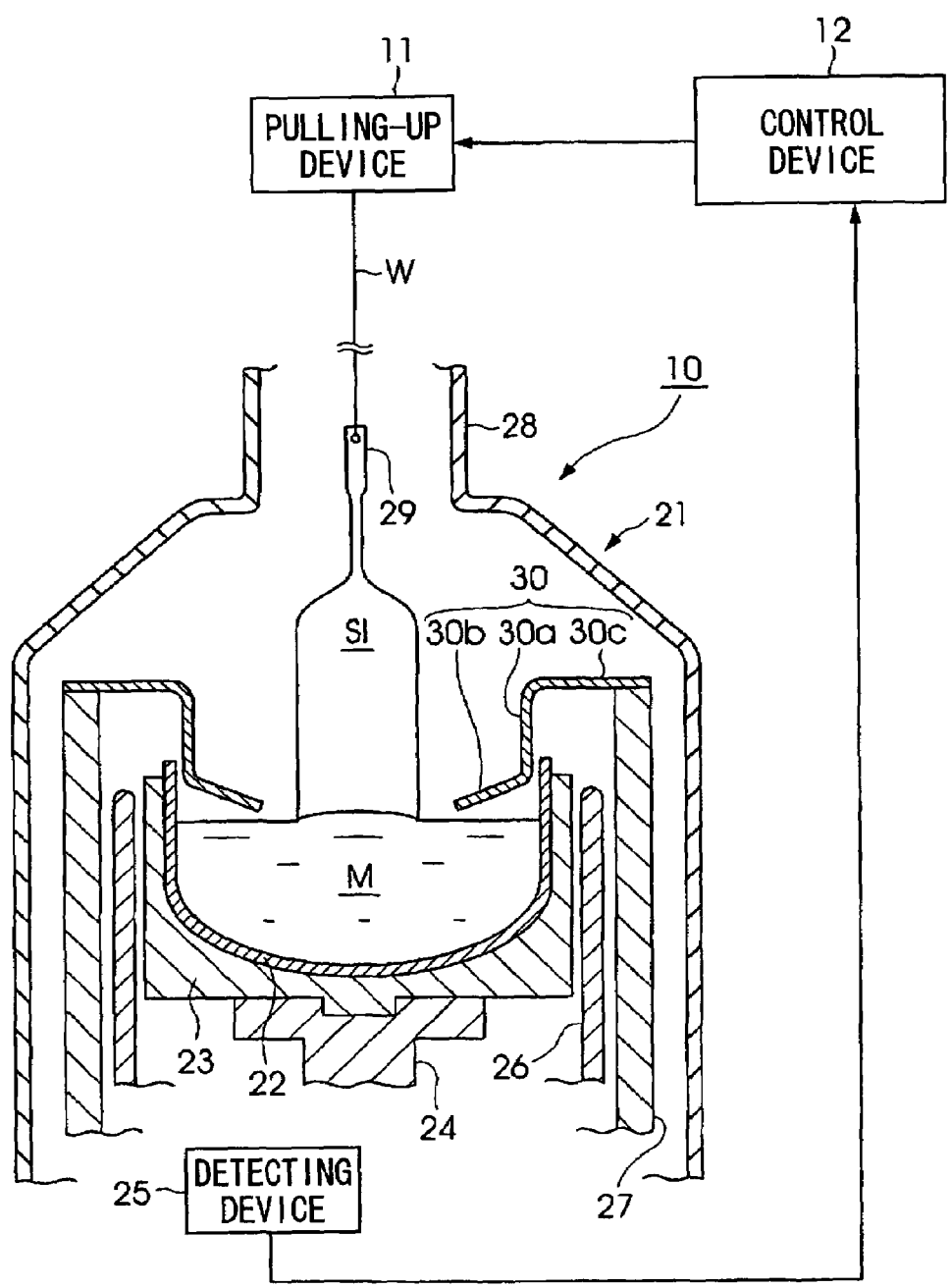
FIG. 1 is a figure showing an overall structure of an embodiment of the apparatus for manufacturing a silicon single crystal according to the present invention.

Preferred embodiments of the apparatus and the method for manufacturing a silicon single crystal according to the present invention will be explained in detail with reference to the figures. FIG. 1 is a figure showing an overall structure of an apparatus for manufacturing a silicon single crystal according to the preferred embodiment of the present invention. As shown in this figure, this apparatus of the preferred embodiment includes a main body portion 10, a pulling-up device 11, and a control device 12. In a chamber 21 of the main body portion 10, there is provided a crucible 22 which receives molten silicon M, and an outer circumferential surface of this crucible 22 is covered over by a graphite susceptor 23. The crucible 2 is made from quartz or the like.

Via the above described graphite susceptor 23, a bottom surface of the crucible 22 is fixed to an upper end of a support shaft 24, and a lower portion of this support shaft 24 is connected to a crucible drive device which is not shown in the figure. This crucible drive device not shown in the figures includes a first motor for rotation which rotates the crucible 22 in a horizontal position, and a motor for lifting and lowering the crucible 22. By the actions of these two motors, the crucible 22 can rotate in the horizontal position, while it can be shifted in a upwards and a downwards directions. In a neighborhood of the crucible 22, there is provided a detecting device 25 which detects a position of the crucible 22 in a vertical direction.

Although, in FIG. 1, the detecting device 25 is shown in a simplified manner, this detecting device 25 may be a device such as a potentiometer or the like which detects the position of the crucible 22 in the vertical direction in a non contact manner, for example, by irradiating a laser light, ultrasonic waves or the like to an upper end of an outer circumferential portion of the crucible 22. Results of this detection by the detecting device 25 is outputted to the control device 12. The outer circumferential surface of the crucible 22 is surrounded by a heater 26 which is arranged with a predetermined gap spacing between them. An outer circumferential surface of this heater 26 is surrounded by an insulation tube 27 which is arranged with a predetermined gap spacing between them. The heater 26 includes, for example, a high frequency heating device or a resistance heating device, and heats and melts a polycrystalline silicon of high purity charged into the crucible 22 into the molten silicon M.

Detection of the position of the crucible 22 in the vertical direction by the detecting device 25 is performed by taking a lower edge of a cone portion 30b, or an upper edge of the heater 26 as a standard, or by taking a combination of these as a standard, and detecting a relative vertical position of an upper edge of the crucible 22 with respect to this standard. Here, each of the position in the vertical direction of the lower edge of the cone portion 30b and the position in the vertical direction of the upper edge of the heater 26 taken as a standard may be different for each example of this apparatus, or may be different for each production batch. Therefore, for each production batch, when setting up for pulling up the silicon single crystal, the position taken as the standard is confirmed by the detecting device 25. Furthermore, there is also a possibility that the position of the crucible 22 on the support shaft 24 may be different for each example of this apparatus, or may be different for each production batch. Therefore, for each production batch, when setting up for pulling up the silicon single crystal, the position of the crucible 22 is confirmed by the detecting device 25 for this reason as well.

A casing 28 shaped as a circular cylinder is connected at an upper end of the chamber 21. A pulling-up device 11 is provided at an upper end portion of this casing 28. The pulling-up device 11 includes a pulling up head (not shown in the figure) which is provided so as to be able to rotate in a horizontal position, a second motor for rotation (also not shown in the figure) which rotates the pulling up head in the horizontal position, a pulling up wire W which extends vertically downwards from the pulling up head towards a rotational center of the crucible 22, and a pulling up motor (likewise not shown in the figure) which is provided in the pulling up head and winds up or pays out the pulling up wire W. At a lower end of the pulling up wire W, there is attached a seed crystal 29 for being dipped into the molten silicon M and pulling up a silicon single crystal SI.

Between an outer circumferential surface of the silicon single crystal SI and an inner circumferential surface of the crucible 22, there is provided a heat shield member 30 which surrounds the outer circumferential surface of the silicon single crystal SI. This heat shield member 30 is formed in a generally circular tubular shape, and it includes a tubular portion 30a which intercepts radiant heat from the heater 26, the cone portion 30b which extends in a downwards and inwards direction from a lower edge of the tubular portion 30a so that its diameter becomes progressively smaller, and a flange portion 30c which extends outwards from an upper edge of the tubular portion 30a in approximately the horizontal direction. By the outer edge of the above described flange portion 30c being mounted to the upper edge of the insulation tube 27, this heat shield member 30 is fixed within the chamber 21 so that the lower edge of the cone portion 30b is positioned at just a predetermined distance above the surface of the molten silicon M. This heat shield member 30 is made from graphite.

The control device 12 controls the pulling rate for the silicon single crystal SI based on the position in the vertical direction of the crucible 22 detected by the detecting device 25. In concrete terms, the control device 12 stores positions of the crucible 22 in the vertical direction during the manufacturing procedure for a silicon single crystal SI over a plurality of times in the past (i.e. for a number of past production batches), and calculates an average crucible position by taking an average of them. And it controls the pulling rate for the silicon single crystal SI based on an amount of positional deviation which is a value obtained by subtracting the average crucible position from the detected position of the crucible obtained by the detecting device 25.

Here, it is desirable for the number of production batches n for obtaining the above described average crucible position to be made to a predetermined number or more, since in the case in which it is too small, an accuracy is deteriorated. And it is also desirable for this number to be kept the other number or less. Because since in the case in which the number of production batches n is too large, crucible positions which vary greatly for example before and after changing the crucible 22 and the susceptor 23 are included, resulting in deterioration of the accuracy as well. It is preferable to set the number of the production batches n within a range from 3 to 25, and it is more preferable to set n to about 7 or 8. Here it is understood that the number of production batches performed in a single month with such an apparatus for manufacturing a silicon single crystal is about 10 to 20.

It is desirable to compensate the pulling rate for the silicon single crystal SI which is controlled by the control device 12 within a range from 0% to 5% of an initial speed which is determined in advance, per 1 mm of the amount of the positional which is a value obtained by subtracting the average crucible position from the detected position of the crucible. Here, the control device 12 sets the pulling rate for the silicon single crystal to be higher than the above described initial speed, in the case in which the above described amount of the positional deviation is positive (in other words, in the case in which the crucible 22 is positioned at or above the average crucible position). In the case in which the amount of the positional deviation is negative (in other words, in the case in which the crucible 22 is positioned below the average crucible position), the control device 12 sets the pulling rate for the silicon single crystal to be lower than the above described initial speed.

In the case in which the compensation amount for the pulling rate for the silicon single crystal SI is set to be larger than 5% of the initial speed, this compensation amount is too large. Therefore, according to this preferred embodiment of the present invention, the compensation amount for the pulling rate is limited to within 5% of the initial speed. Furthermore, in the case in which the crucible 22 is positioned above the average crucible position (i.e., in the case in which the above described amount of positional deviation is positive), the proportion of heat conduction from the bottom portion of the crucible 22 is increased, and the temperature gradient G becomes large. Considering these, the value of V/G is constrained to be within a predetermined range by setting the pulling rate for the silicon single crystal to be higher than the above described initial speed. Conversely, in the case in which the crucible 22 is positioned below the average crucible position (i.e., in the case in which the above described amount of positional deviation is negative), the proportion of heat conduction from the side portion of the crucible 22 is increased, and the temperature gradient G becomes small. Considering these, the value of V/G is constrained to be within the predetermined range by setting the pulling rate for the silicon single crystal to be lower than the above described initial speed.

Furthermore, in the preferred embodiment of the present invention, the control device 12 calculates a standard deviation σ of the positions of the crucible 22 in the vertical direction during the manufacturing procedure for the silicon single crystal SI over a plurality of times in the past (i.e. for a number of past batches). And, in the case in which the above described amount of the positional deviation is outside a range of −3σ to +3σ, this amount of the positional deviation is set to −3σ or +3σ respectively. This is to limit the compensation amount for the pulling rate for the silicon single crystal SI in the same manner as described above.

Figure 2:
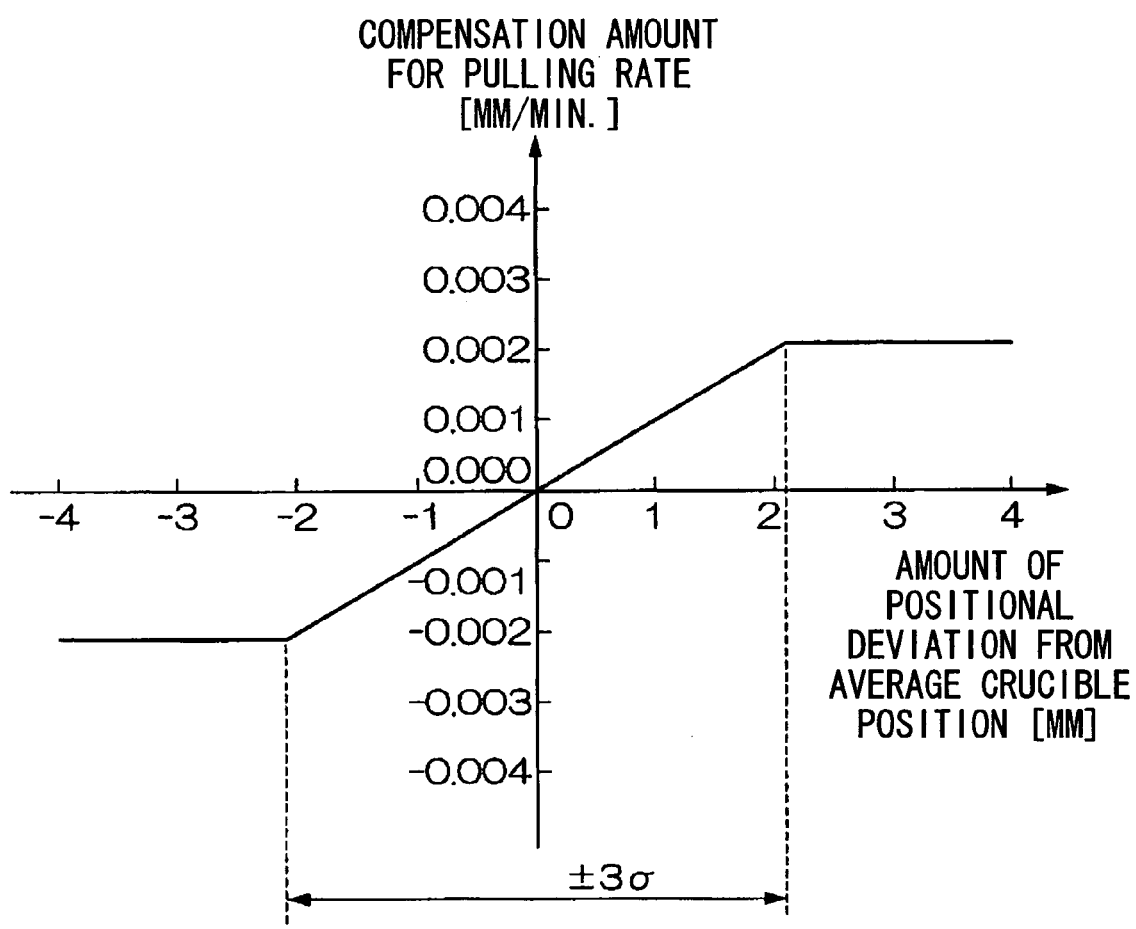
FIG. 2 is a figure showing an example of a relationship between the amount of the positional deviation of the crucible from the average crucible position, and compensation amount for the pulling rate.

FIG. 2 is a figure showing an example of a relationship between the amount of the positional deviation of the crucible 22 from the average crucible position, and the compensation amount for the pulling rate. As shown in FIG. 2, in the case in which the amount of the positional deviation from the average crucible position of the crucible 22 is within the range of −3σ to +3σ and the amount is positive, the compensation amount for the pulling rate increases almost proportionally to the amount of the positional deviation. Conversely, in the case in which the amount of the positional deviation is negative, the compensation amount for the pulling rate decreases almost proportionally to the amount of positional deviation.

In the case in which the amount of the positional deviation of the crucible 22 from the average crucible position exceeds +3σ, the compensation amount for the pulling rate is set to the same value as that when the amount of positional deviation is +3σ. Conversely, in the case in which the amount of the positional deviation of the crucible 22 from the average crucible position is lower than −3σ, the compensation amount for the pulling rate is set to the same value as that when the amount of positional deviation is −3σ.

In order to manufacture the silicon single crystal SI using the apparatus of the above described structure, first, the polycrystalline silicon raw material charged in the crucible 22 is heated up with the heater 26 and is melted to molten silicon M, and a temperature of this molten silicon M is heated to and kept a predetermined temperature. Next, the position of the crucible 22 in the vertical direction is set so that a gap between a liquid surface of the molten silicon M filled in the crucible 22 and a lower end of the heat shield member 30 (the lower edge of its cone portion 30b) provided at the upper portion of the crucible 22 becomes equal to a predetermined distance. Next, a seed crystal 29 is fixed to a lower tip of the pulling up wire W, and the pulling up wire W is lowered downwards so that a lower end of the seed crystal 29 comes into contact with a surface of the molten silicon M. The pulling up upwards of the silicon single crystal SI is started from this state.

When pulling the pulling up wire W upwards, along with rotating the crucible 22 at a rotational speed of for example about 0.1 to 20 $min^{-1}$, the silicon single crystal SI which is being pulled out is rotated in the opposite direction at a rotational speed of for example about 1 to 25 $min^{-1}$. Here, it should be understood that when pulling up the silicon single crystal SI, it may also be the case that the crucible 22 and the silicon single crystal SI are both rotated in the same direction.

The results from the detecting device 25 of its detection of the position of the crucible 22 in the vertical direction are outputted to the control device 12 during the process of pulling up the silicon single crystal SI. The control device 12 calculates the amount of the positional deviation of the crucible 22 by subtracting this detected result from the average crucible position. Here, it should be understood that the explanation has followed a course in which the average crucible position is calculated by the control device 12 after the manufacturing procedure for the silicon single crystal SI has been performed a plurality of times in the past, so that a track record has been established. On the other hand, when initially manufacturing the first silicon single crystal SI after having set up this apparatus for manufacturing a silicon single crystal, this average crucible position has not yet been obtained. Therefore, it is desirable, at this time, for example, to follow the procedure of taking the position of the crucible in the vertical direction at the time of starting the manufacture of the silicon single crystal SI as being the average crucible position on a temporary basis.

After the amount of positional deviation of the crucible 22 is calculated, the control device 12 calculates compensation amount for the pulling rate for the silicon single crystal SI by using the amount of the positional deviation which has been calculated, and the relationship between the amount of positional deviation of the crucible 22 from the average crucible position and the compensation amount for the pulling rate shown in FIG. 2. Using this compensation amount for the pulling rate, the pulling rate is obtained by compensating the initial speed which has been set in advance. And a control signal which corresponds to this pulling rate is outputted to the pulling-up device 11, and thereby the pulling rate for the silicon single crystal SI is controlled.

In the case in which the crucible 22 is positioned so as to be higher than the average crucible position, due to this speed compensation, the pulling rate of the silicon single crystal is set to be higher than the above described initial pulling rate. On the other hand, in the case in which the crucible 22 is positioned so as to be lower than the average crucible position, the pulling rate of the silicon single crystal is set to be lower than the above described initial pulling rate. By doing this, it is possible to keep the value of V/G within the predetermined range, and it is possible to manufacture a silicon single crystal with stable product quality. It should be understood that, when manufacturing the silicon single crystal SI in this manner, the control device 12 also performs control by minutely adjusting the position of the liquid surface of the molten silicon M so as to keep constant the distance (the gap) between the liquid surface of the molten silicon M charged in the crucible 22, and the lower end of the heat shield member 30 (the lower edge of its cone portion 30b) provided at the upper portion of the crucible 22.

EXAMPLES

Figure 3:
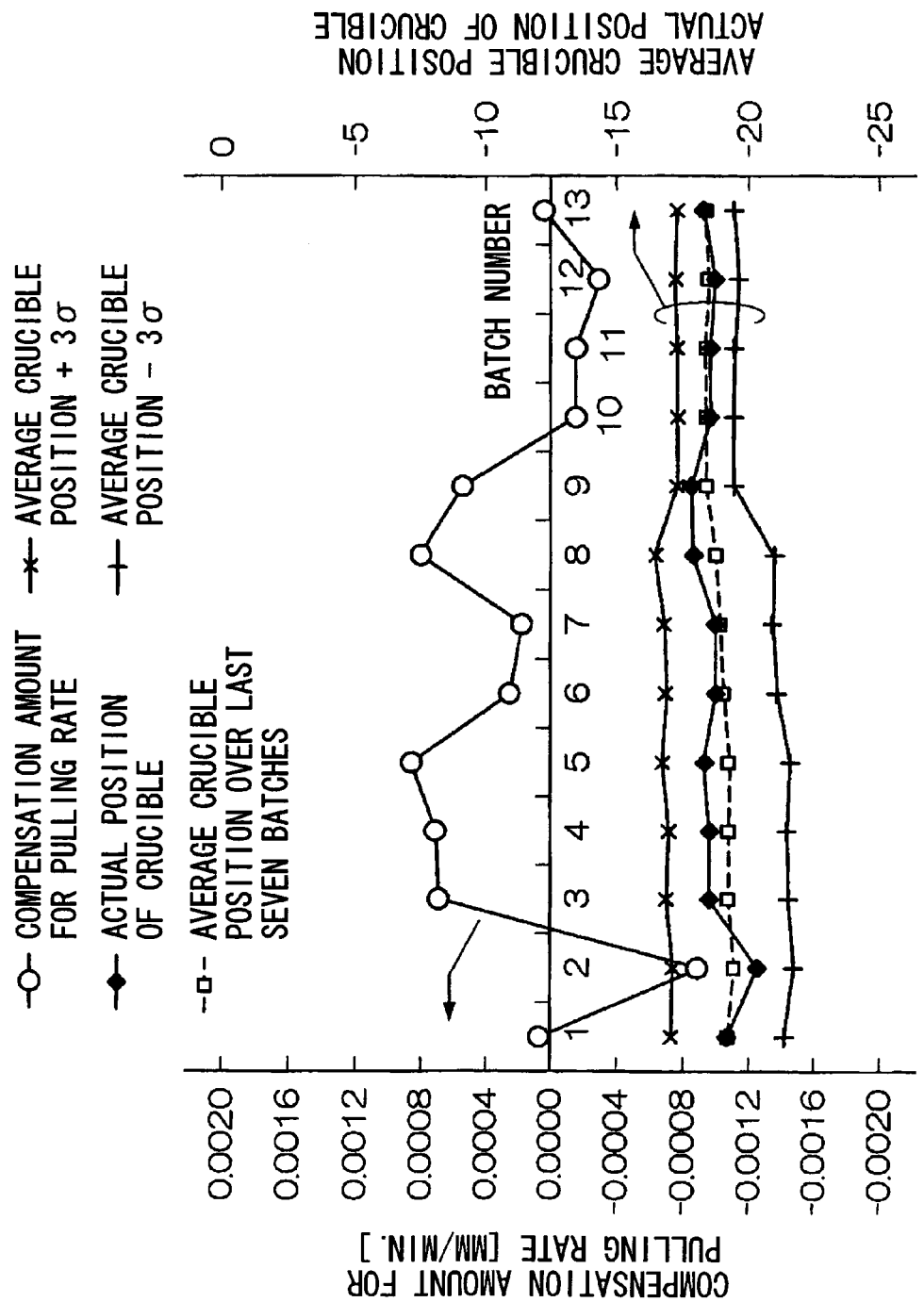
FIG. 3 is a figure showing the position of the crucible, the compensation amount for the pulling rate, and the average crucible position during manufacturing a silicon single crystal according to an example of the present invention.

The inventors have manufactured silicon single crystals SI using the above described apparatus and method for manufacturing a silicon single crystal. In the examples, silicon single crystals SI of diameter 200 mm were manufactured. FIG. 3 is a figure showing the crucible position, the compensation amount for the pulling rate, and the like during manufacturing a silicon single crystal according to the preferred embodiment of the present invention. Here, in FIG. 3, the batch number is shown along the horizontal axis, while the compensation amount for the pulling rate, and the average crucible position and the actual position of the crucible are shown along the vertical axis.

Referring to FIG. 3, it is understood that the position of the crucible 22 in the vertical direction (the actual position of the crucible) does not change excessively from batch to batch, but it is not constant and changes little by little between batches. Also, when the average crucible position (the crucible position averaged over the last seven batches) is considered, with increase of the batch number, this position changes gradually in a constant direction (in the example shown in FIG. 3, the upwards direction).

Moreover, when the compensation amount for the pulling rate and the position of the crucible 22 in the vertical direction (the actual position of the crucible) are compared together, it is understood that there is also a tendency for the compensation amount for the pulling rate to change according to a change of the position of the crucible 22 in the vertical direction. In other words, in the case in which the position of the crucible 22 in the vertical direction is low (for example, when the batch number is 2), the compensation amount for the pulling rate assumes a negative value. In contrast, in the case in which the position of the crucible 22 in the vertical direction is high (for example, when the batch number is 3), the compensation amount for the pulling rate assumes a positive value.

FIG. 4 is a figure showing an example of measurement results for external diameters of OSF rings in silicon wafers manufactured using the apparatus and the method for manufacturing a silicon single crystal of the present invention, and those manufactured without using the same. In this figure, the batch number is shown along the horizontal axis, and the external diameter of the OSF ring (its average total length) is shown along the vertical axis. Here, in FIG. 4, results of which the batch number is twelve or less are obtained without using the apparatus and the method for manufacturing a silicon single crystal according to the present invention. Results of which the batch number is thirteen or larger are obtained using the apparatus and the method for manufacturing a silicon single crystal according to the present invention.

As shown in FIG. 4, under conditions by which OSF regions are formed, in the results obtained using the above described apparatus and the method for manufacturing a silicon single crystal according to the present invention, the variation in the distribution of the OSF diameter is less, as compared with the results without using the apparatus and the method. Accordingly, it is possible to stabilize the product quality.

Furthermore, under conditions by which OSF rings are closed and no dislocation clusters are generated, in the results obtained using the above described apparatus and the method for manufacturing a silicon single crystal according to the present invention, dislocation cluster faults are reduced by 5%, as compared with the results without using the apparatus and the method.

Although the present invention has been described above in terms of preferred embodiments thereof, it should not be considered as being limited to the above described contents; it may be freely varied, within its legitimate and proper scope. For example, the application of the above described preferred embodiments to the case of manufacturing a silicon single crystal SI without applying any magnetic field to the molten silicon in the crucible 22 is disclosed by way of example, and is not limitative of the present invention; it would also be acceptable to manufacture the silicon single crystal SI while applying a horizontal magnetic field or a cusp magnetic field to the molten silicon. Furthermore, the present invention is not particularly limited as to the diameter or the size of the silicon single crystal which is manufactured thereby; it would be possible to apply the present invention to the manufacture of a silicon single crystal having any desired diameter.

Thus, while preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a silicon single crystal comprising:

detecting a position in a vertical direction of a crucible when pulling up a silicon single crystal from a molten silicon in the crucible to grow; and controlling a pulling rate of the silicon single crystal, based on the detected position of the crucible, wherein the controlling of the pulling rate further comprises:

calculating an average crucible position by taking an average of positions of the crucible in the vertical direction during manufacturing silicon single crystals over a plurality of times in the past; and controlling the pulling rate for the silicon single crystal, based on an amount of positional deviation which is a value obtained by subtracting the average crucible position from the detected position of the crucible, in the controlling of the pulling rate, the pulling rate for the silicon single crystal is set to be higher than an initial speed which is set in advance when the amount of positional deviation is positive, the pulling rate for the silicon single crystal is set to be lower than the initial speed when the amount of positional deviation is negative, and the pulling rate for the silicon single crystal is set higher or lower within a range from 0% to 5% of the initial speed per 1 mm of the amount of positional deviation.

2. A method for manufacturing a silicon single crystal comprising:

detecting a position in a vertical direction of a crucible when pulling up a silicon single crystal from a molten silicon in the crucible to grow; and controlling a pulling rate of the silicon single crystal, based on the detected position of the crucible, wherein the controlling of the pulling rate further comprises:

calculating an average crucible position by taking an average of positions of the crucible in the vertical direction during manufacturing silicon single crystals over a plurality of times in the past;

controlling the pulling rate for the silicon single crystal, based on an amount of positional deviation which is a value obtained by subtracting the average crucible position from the detected position of the crucible;

calculating a standard deviation σ of the positions of the crucible in the vertical direction during manufacturing the silicon single crystals over a plurality of times in the past, and controlling the pulling rate for the silicon single crystal as the amount of positional deviation being 3σ when the amount of positional deviation is larger than 3σ.

* * * * *